(12) United States Patent
Kawano

(10) Patent No.: US 6,801,464 B2
(45) Date of Patent: Oct. 5, 2004

(54) SEMICONDUCTOR MEMORY DEVICE

(75) Inventor: Tomohito Kawano, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/447,327

(22) Filed: May 28, 2003

(65) Prior Publication Data

US 2003/0235093 A1 Dec. 25, 2003

(30) Foreign Application Priority Data

May 29, 2002 (JP) .................................... 2002-155787

(51) Int. Cl.[7] .............................................. G11C 7/00
(52) U.S. Cl. .................... 365/203; 365/205; 365/210
(58) Field of Search ............................ 365/203, 205, 365/210, 204, 189.01

(56) References Cited

U.S. PATENT DOCUMENTS 6,208,571 B1    3/2001   Ikeda et al.
6,324,112 B1 *  11/2001  Fournel ...................... 365/207

* cited by examiner

Primary Examiner—David Lam
(74) Attorney, Agent, or Firm—Hogan & Hartson, LLP

(57) ABSTRACT

A semiconductor memory device includes a data line array connected to a memory cell array, a read circuit configured to charge selected data lines to read data, and a non-selection-side charge circuit configured to charge non-selected data lines. In the data line array, a first group of lower order 8 bit data lines and a second group of higher order 8 bit data lines are alternately disposed one line by one line. The read circuit selects and charges all the 16 bit data lines in a word data read mode, while it selects and charges one of the first and second groups in a byte data read mode. The non-selection-side charge circuit selects and charges non-selected data lines, which belong to the other of the first and second groups not selected by the read circuit in the byte data read mode.

18 Claims, 8 Drawing Sheets

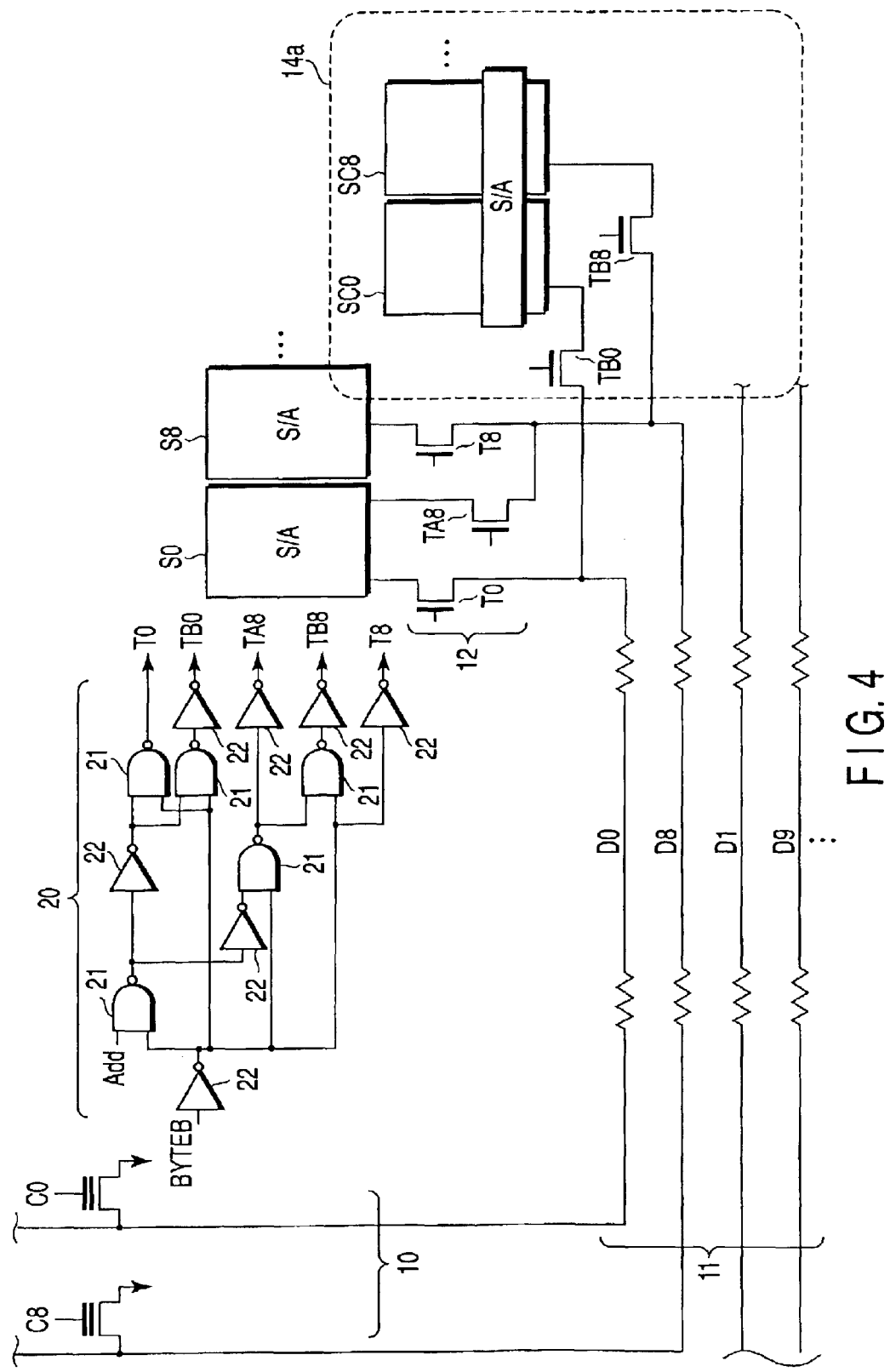
F I G. 4

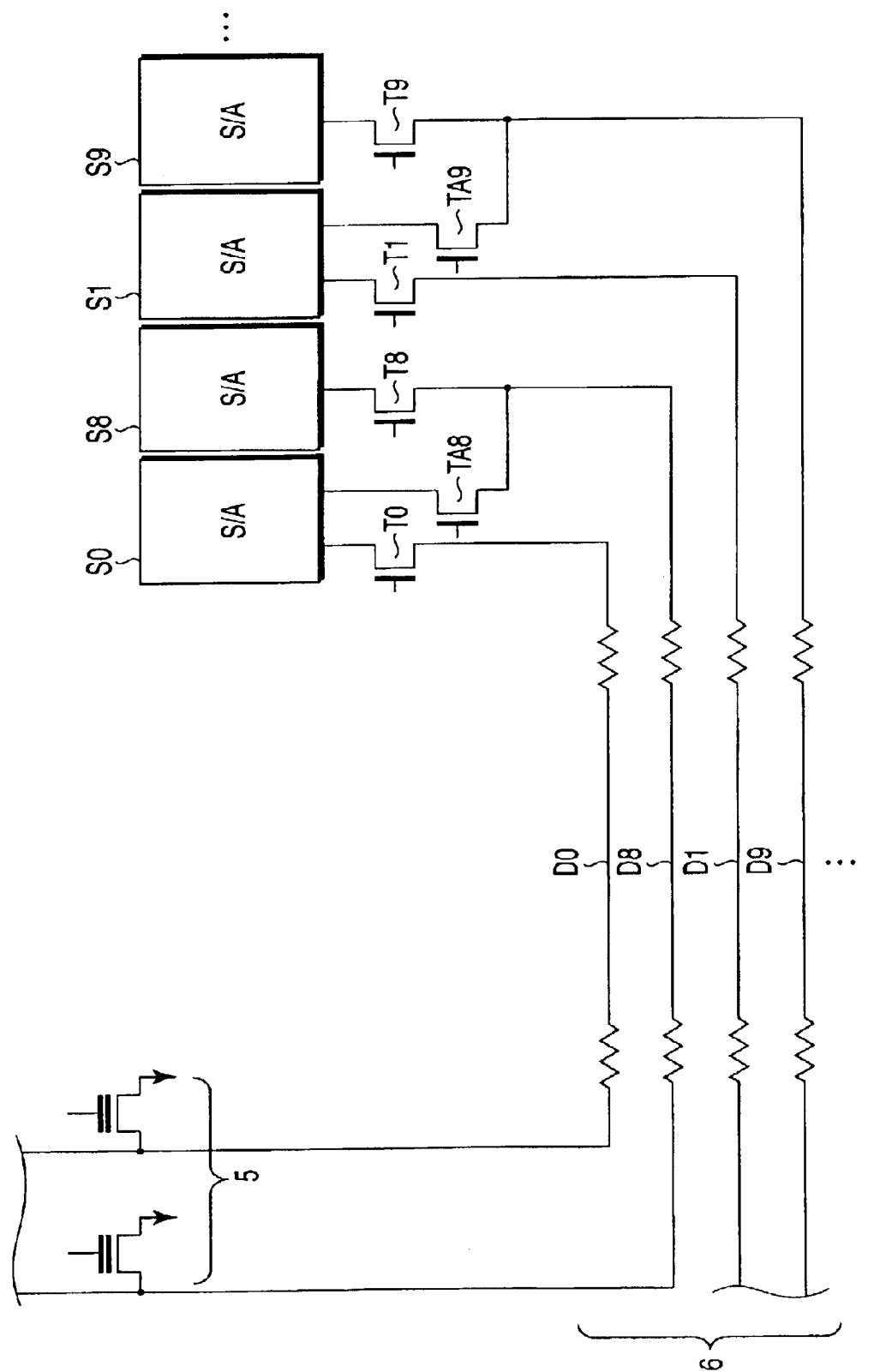
F I G. 10

SEMICONDUCTOR MEMORY DEVICE

CROSS-REFERENCE TO RELATED APPLICATIONS

This application is based upon and claims the benefit of priority from the prior Japanese Patent Application No. 2002-155787, filed May 29, 2002, the entire contents of which are incorporated herein by reference.

BACKGROUND OF THE INVENTION

1. Field of the Invention

The present invention relates to a semiconductor memory device, and particularly to an improvement to a semiconductor memory device, which can switch between a mode of reading word data and a mode of reading byte data. For example, this semiconductor memory device is applied to a NOR-type flash memory.

2. Description of the Related Art

There is known a NOR-type flash memory, which can switch between a mode of reading word data (WORD read mode) and a mode of reading byte data (BYTE read mode). FIG. 10 is a circuit diagram showing a part of a conventional NOR-type flash memory of this kind.

As shown in FIG. 10, a data line array 6 is connected to a memory cell array 5. The data line array 6 includes data lines D0, D8, D1, D9, ..., D7, and D15 (D2 to D7 and D10 to D15 are not shown) of 16 bits constituting word data. The 16 bit data lines D0 to D15 are arranged such that data lines D0, D1, ..., and D7 of the lower order 8 bits and data lines D8, D9, ..., and D15 of the higher order 8 bits are alternately disposed one by one.

The 16 bit data lines D0 to D15 are respectively connected to 16 sense amplifiers (S/A) S0, S8, S1, S9, ..., S7, and S15 (S2 to S7 and S10 to S15 are not shown), through 16 transistors T0, T8, T1, T9, ..., T7, and T15 (T2 to T7 and T10 to T15 are not shown). The higher order 8 bit data lines D8 to D15 are also respectively connected to the lower order 8 sense amplifiers S0 to S7, through 8 transistors TA8 to TA15 (TA10 to TA15 are not shown).

In the WORD read mode, when data is read, the 16 bit data lines D0 to D15 are selected and charged all together. On the other hand, in the BYTE read mode, the lower order 8 bit data lines D0 to D7 or the higher order 8 bit data lines D8 to D15 are selected and charged. At this time, the non-selected higher order 8 bit data lines D8 to D15 or the non-selected lower order 8 bit data lines D0 to D7 are set at the ground potential.

As described later, the present inventor has found that the conventional NOR-type flash memory shown in FIG. 10 causes a problem in that the data read speed in the BYTE read mode is lower than that in the WORD read mode.

BRIEF SUMMARY OF THE INVENTION

According to a first aspect of the present invention, there is provided a semiconductor memory device comprising:

a memory cell array;

a data line array connected to the memory cell array, and comprising 16 bit data lines for 16 bits constituting word data, the 16 bit data lines being arranged such that a first group of lower order 8 bit data lines and a second group of higher order 8 bit data lines are alternately disposed one line by one line;

a read circuit configured to perform selection of the data lines, and charge selected data lines to read data, the read circuit being arranged to select and charge all the 16 bit data lines when reading data in a word data read mode, and to select and charge one of the first and second groups when reading data in a byte data read mode; and a non-selection-side charge circuit configured to select and charge non-selected data lines, which belong to the other of the first and second groups not selected by the read circuit when reading data in the byte data read mode.

According to a second aspect of the present invention, there is provided a semiconductor memory device comprising:

a memory cell array;

a data line array connected to the memory cell array, and comprising 16 bit data lines for 16 bits constituting word data, the 16 bit data lines being arranged such that a first group of lower order 8 bit data lines and a second group of higher order 8 bit data lines are disposed adjacent to each other group by group;

an intermediate dummy data line extending in parallel with the data lines in a boundary region between the first group and the second group;

a read circuit configured to perform selection of the data lines, and charge selected data lines to read data, the read circuit being arranged to select and charge all the 16 bit data lines when reading data in a word data read mode, and to select and charge one of the first and second groups when reading data in a byte data read mode; and a first dummy-side charge circuit configured to charge the intermediate dummy data line when reading data in the word data read mode and the byte data read mode.

BRIEF DESCRIPTION OF THE SEVERAL VIEWS OF THE DRAWING

FIG; 1 is a circuit diagram showing a part of a NOR-type flash memory, which is a semiconductor memory device according to a first embodiment of the present invention;

FIG. 4 is a circuit diagram showing a part of a NOR-type flash memory, which is a semiconductor memory device according to a modification 1 of the first embodiment;

FIG. 10 is a circuit diagram showing a part of a conventional NOR-type flash memory.

DETAILED DESCRIPTION OF THE INVENTION

In the process of developing the present invention, the inventor conducted research on the conventional NOR-type flash memory shown in FIG. 10, in relation to causes of a decrease in data read speed in the BYTE read mode. As a result, the inventors have arrived at the findings given below.

Specifically, the memory shown in FIG. 10 performs the BYTE read mode, for example, such that the lower order 8 bit data lines D0 to D7 are selected and charged, while the rest of the lines, i.e., the higher order 8 bit data lines D8 to D15, are not selected but set at the ground potential. In this case, the potential difference becomes large between the selected data lines D0 to D7 of the lower order 8 bits and non-selected data lines D8 to D15 of the higher order 8 bits, which are adjacent to each other one by one. As a consequence, for the sense amplifiers S0 to S7 connected to the selected data lines D0 to D7, the coupling capacitance on the data line side is larger in the BYTE read mode than in the WORD read mode.

Figure 3:
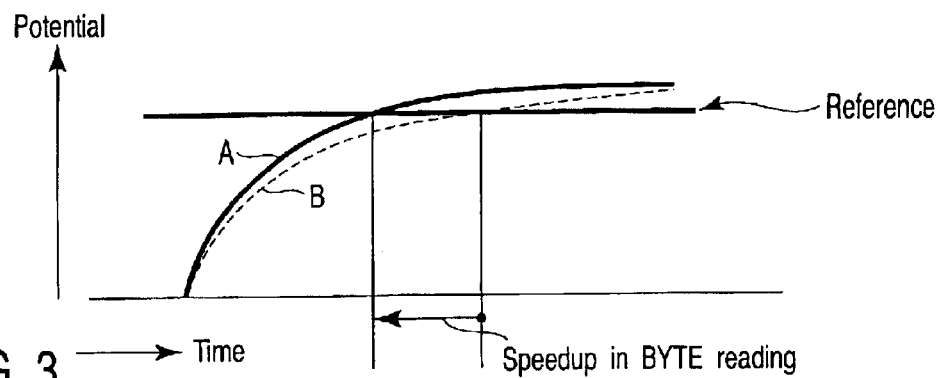
FIG. 3 is a graph showing potential increase of data lines in data read.

The coupling capacitance described above influences the potential increase of data lines in data read. FIG. 3 is a graph showing potential increase of data lines in data read. In FIG. 3, the horizontal axis denotes time, and the vertical axis denotes potential. Also in FIG. 3, a solid line A shows the characteristic in the WORD read mode, and a broken line B shows the characteristic in the BYTE read mode. As shown in FIG. 3, the potential increase of data lines is slower in the BYTE read mode than in the WORD read mode.

As the potential increase of data lines is slower, the data read speed is slower. Accordingly, in the memory shown in FIG. 10, the data read speed is slower in the BYTE read mode than in the WORD read mode. This causes a problem, when a high read speed is required equally in the two modes.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
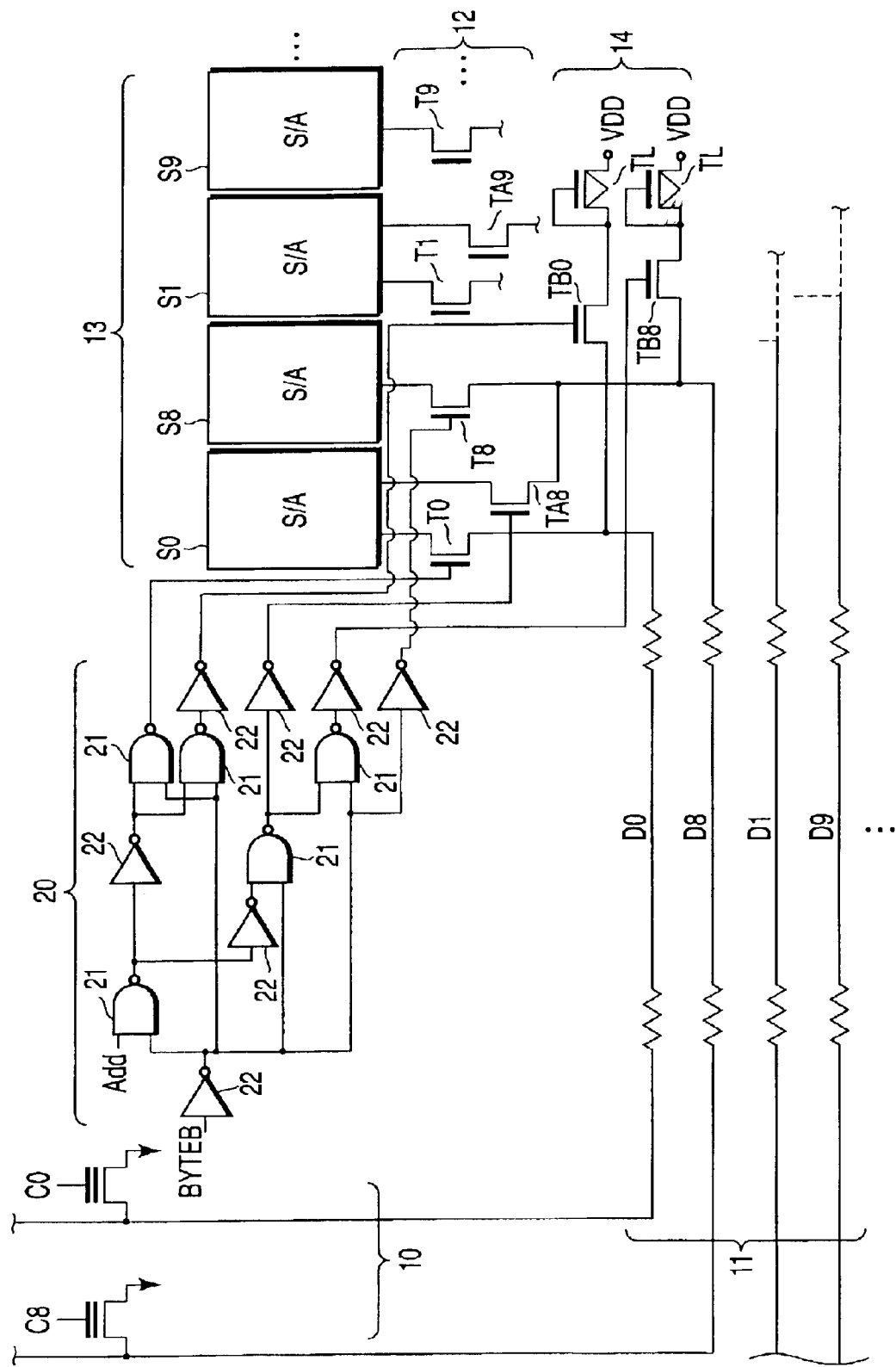

FIG. 1 is a circuit diagram showing a part of a NOR-type flash memory, which is a semiconductor memory device according to a first embodiment of the present invention. This memory can switch between a WORD read mode and a BYTE read mode, in accordance with a control signal, e.g., externally inputted.

As shown in FIG. 1, a data line array 11 is connected to a memory cell array 10. The memory cell array 10 includes memory cells of the NOR-type flash memory arrayed in a matrix format. FIG. 1 shows, as examples, a memory cell connected to a data line D0 and to be selected by a column decoding signal C0, and a memory cell connected to a data line D8 and to be selected by a column decoding signal C8.

The data line array 11 includes data lines D0, D8, D1, D9, ..., D7, and D15 (D2 to D7 and D10 to D15 are not shown) arrayed in parallel with each other at regular intervals, to which 16 bits of data constituting word data stored in the memory cell array 10 are respectively read out. The 16 bit data lines D0 to D15 are arranged such that data lines D0, D1, ..., and D7 of the lower order 8 bits and data lines D8, D9, ..., and D15 of the higher order 8 bits are alternately disposed one by one.

In the following explanation, decimal numbers 0 to 7 corresponding to the lower order 8 bits of the 16 bits are denoted by "n" (n is an integer of 0 to 7), and decimal numbers 8 to 15 corresponding to the higher order 8 bits thereof are denoted by "n+8" (n is an integer of 0 to 7), when necessary. For example, the 16 bit data lines D0, D8, D1, D9, ..., D7, and D15 are indicated with Dn and Dn+8, the lower order 8 bit data lines D0 to D7 with Dn, and the higher order 8 bit data lines D8 to D15 with Dn+8. Also in the following explanation, the lower order 8 bits and higher order 8 bits are simply referred to as lower order bits and higher order bits, respectively, when necessary.

A read circuit is arranged to read word data or byte data in accordance with the WORD read mode or BYTE read mode. The read circuit has a sense amplifier array 13 for charging selected data lines to read data. The data line array 11 is connected to the sense amplifier array 13 through a switch element group 12.

In the WORD read mode, when data is read, 16 bit data lines Dn and Dn+8 are selected all together by the switch element group 12, and charged by the sense amplifier array 13. On the other hand, in the BYTE read mode, when data is read, the group of lower order 8 bit data lines Dn or the group of higher order 8 bit data lines Dn+8 (i.e., alternate data lines) are selected by the switch element group 12, and charged by the sense amplifier array 13.

Specifically, the sense amplifier array 13 includes 16 sense amplifiers (S/A) S0, S8, S1, S9, ..., S7, and S15 (S2 to S7 and S10 to S15 are not shown) arrayed in correspondence to the 16 bit data lines Dn and Dn+8. Each of the sense amplifiers Sn and Sn+8 includes a data line load transistor (described later) for charging a selected data line, and a charge timing control transistor (described later).

The switch element group 12 includes 16 first transistors of the NMOS type T0, T8, T1, T9, ..., T7, and T15 (T2 to T7 and T10 to T15 are not shown) for reading word data or byte data, arrayed in correspondence to the 16 bit data lines Dn and Dn+8. The 16 bit data lines Dn and Dn+8 are respectively connected to the sense amplifiers Sn and Sn+8 through the first transistors Tn and Tn+8.

The switch element group 12 also includes 8 second transistors of the NMOS type TA8 to TA15 (TA10 to TA15 are not shown) for byte switch and selection. The higher order 8 bit data lines Dn+8 are respectively connected to the lower order 8 sense amplifiers Sn through the second transistors TAn+8. In other words, each of the lower order 8 sense amplifiers Sn is assigned to a pair of one of the lower order 8 bit data lines Dn and one of the higher order 8 bit data lines Dn+8, as a common sense amplifier for reading byte data.

Furthermore, a charge circuit 14 is connected to the 16 bit data lines Dn and Dn+8 to select and charge non-selected data lines, i.e., data lines not selected by read circuit, when data is read in the BYTE read mode. The charge circuit 14 includes, for example, 16 data line load transistors TL respectively connected to the 16 bit data lines Dn and Dn+8. Between the data lines Dn and Dn+8 and the load transistors TL, 16 third transistors of the NMOS type TB0, TB8, ..., TB7, and TB15 (TB1 to TB7 and TB9 to TB15 are not shown) for selecting non-selected data lines are respectively interposed.

The first transistors Tn and Tn+8, second transistors TAn+8, and third transistors TBn and TBn+8 are switched by a control signal generation circuit 20. The control signal generation circuit 20 is a logic circuit constituted of logic gates including a group of NAND gates 21 and a group of inverters 22, to generate and supply signals for performing control as follows.

When a BYTE read mode setting signal BYTE is at "H", the WORD read mode is set. In this case, the control signal generation circuit 20 generates control signals to perform the following operation. Specifically, all the first transistors Tn and Tn+8 are turned on. All the second transistors TAn+8 are turned off. All the third transistors TBn and TBn+8 are turned off.

On the other hand, when the BYTE read mode setting signal BYTEB is at "L", the BYTE read mode is set. In this case, the control signal generation circuit 20 generates control signals to perform the following operation. Specifically, the 8 first transistors Tn+8 connected to the higher order bit data lines Dn+8 are turned off.

Furthermore, in the BYTE read mode, when an address signal Add is at "L", the lower order bits are selected. In this case, the control signal generation circuit 20 generates control signals to perform the following operation. Specifically, the 8 first transistors Tn connected to the lower order bit data lines Dn are turned on. The 8 third transistors TBn+8 connected to the higher order bit data lines Dn+8 are tuned on. All the second transistors TAn+8 are turned off. The 8 third transistors TBn connected to the lower order bit data lines Dn are turned off.

In the BYTE read mode, when the address signal Add is at "H", the higher order bits are selected. In this case, the control signal generation circuit 20 generates control signals to perform the following operation. Specifically, all the second transistors TAn+8 are turned on. The 8 third transistors TBn connected to the lower order bit data lines Dn are tuned on. The 8 first transistors Tn connected to the lower order bit data lines Dn are turned off. The 8 third transistors TBn+8 connected to the higher order bit data lines Dn+8 are turned off.

Figure 2:
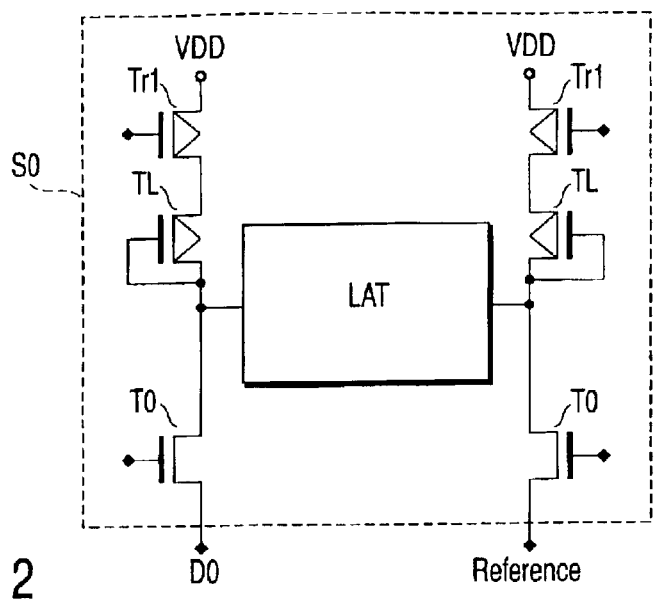
FIG. 2 is a circuit diagram showing a concrete example of one of the sense amplifiers for charging selected data lines in FIG. 1.

FIG. 2 is a circuit diagram showing a concrete example of S0, as one of the sense amplifiers Sn and Sn+8 for charging selected data lines in FIG. 1.

The sense amplifier S0 includes a latch circuit LAT of the current mirror load type. The latch circuit LAT is connected to the data line D0 and a reference data line through a pair of first transistors T0 of the NMOS type. The data line D0 is connected to a memory cell, while the reference data line is connected to a reference cell for generating a reference potential. Load transistors TL of the PMOS type are respectively interposed between the first transistors T0 and power supply nodes. Furthermore, transistors Tr1 of the PMOS type for charge timing control are respectively interposed between the load transistors TL and power supply nodes.

Next, an explanation will be given of an operation of the NOR-type flash memory shown in FIG. 1.

In the WORD read mode, when data is read, the 16 first transistors Tn and Tn+8 are set in the on-state, so that the 16 bit data lines Dn and Dn+8 are selected. The selected 16 bit data lines Dn and Dn+8 are charged all together by the load transistors TL built in the 16 sense amplifiers Sn and Sn+8, so that word data is read out to the sense amplifiers Sn and Sn+8. At this time, the second transistors TAn+8 are set in the off-state, and the third transistors TBn and TBn+8 are also set in the off-state.

On the other hand, in the BYTE read mode, when data is read, the 8 first transistors Tn+8 corresponding to the higher order bits are set in the off-state. In this state, in accordance with the address signal Add, the 8 first transistors Tn corresponding to the lower order bit data lines Dn are set in the on-state, or the 8 second transistors TAn+8 corresponding to the higher order bit data lines Dn+8 are set in the on-state, wherein those transistors are connected to the 8 sense amplifiers Sn for reading byte data.

In the BYTE read mode, when the 8 first transistors Tn corresponding to the lower order bits are set in the on-state, the second transistors TAn+8 are set in the off-state, so that the lower order 8 bit data lines Dn are selected. On the other hand, in the BYTE read mode, when the second transistors TAn+8 are set in the on-state, the 8 first transistors Tn corresponding to the lower order bit data lines Dn are set in the off-state, so that the higher order 8 bit data lines Dn+8 are selected. The alternate 8 bit data lines Dn or Dn+8 thus selected are charged by the data line load transistors built in the 8 sense amplifiers Sn for reading byte data, so that byte data is read out to the sense amplifiers Sn.

In the BYTE read mode, the other data lines Dn+8 or Dn are non-selected data lines present between the selected alternate 8 bit data lines Dn or Dn+8. The 8 third transistors TBn+8 or TBn corresponding to the non-selected data lines Dn+8 or Dn are selected and set in the on-state by the inversion signal (non-selection signal) of the selection signal. The non-selected data lines Dn+8 or Dn thus communicate with the charge circuit 14 and are respectively charged by the corresponding data line load transistors TL. At this time, the other 8 third transistors TBn or TBn+B are set in the off-state. Accordingly, the data lines Dn or Dn+8 corresponding to them are not charged by the data line load transistors TL of the charge circuit 14.

For example, when the first transistor T0 is turned on so that data is read out to the data line D0, the data line D8 adjacent thereto is not selected, but is charged by the corresponding data line load transistor TL through the third transistor TB8 being turned on. At this time, the third transistors TB0 connected to the data line D0 is set in the off-state, so that reading the data line D0 is not affected. As described above, since non-selected data lines are thus charged, there is no difference between the BYTE read mode and WORD read mode in the coupling capacitance of the selected data lines within the data line array. As a consequence, the read speed in the BYTE read mode, which is conventionally slower due to the influence of the coupling capacitance, is increased.

Specifically, the coupling capacitance of the data lines within the data line array appearing when data is read in the BYTE read mode becomes almost the same as that in the WORD read mode. Accordingly, in the NOR-type flash memory shown in FIG. 1, the characteristic of data line potential increase obtained when data is read in the BYTE read mode becomes substantially the same as that in the WORD read mode, which is shown with the solid line A in FIG. 3. As a consequence, this memory can switch between the WORD read mode and BYTE read mode, while insuring a high read speed equally in the two modes.

The charge circuit 14 is preferably arranged to charge non-selected data lines with a potential almost equal to the read potential for selected data lines. This arrangement allows a good balance between the read characteristics in the BYTE read mode and WORD read mode.

The sense amplifiers Sn and Sn+8 and charge circuit 14 may be operated by the same charge control signals, so that the charge circuit 14 starts charging non-selected data lines simultaneously with the timing when the sense amplifiers Sn and Sn+8 starts charging selected data lines. This arrangement provides merits such that the circuit design is easier, the circuit is simpler, and the charge operation can be performed more effectively, since selected data lines and non-selected data lines are charged simultaneously.

The arrangement of the first embodiment described above is also effective in reducing the chip size. Specifically, for example, where the design rule is 0.45 μm, the intervals between data bus lines are currently set at a wide value of about 0.8 μm, to avoid ill effects of capacitance coupling between the data bus lines. On the other hand, as described above, where the influences between adjacent data lines are equal anywhere in data bus lines, the intervals between data bus lines can be set at the minimum value of 0.45 μm. In this case, the area of the data bus line region, which is currently 0.82 $mm^2$, can be reduced to approximately 0.58 $mm^2$, which is about 30% reduction in the pattern area. In page ,mode type products, which are becoming the mainstream, since the number of data bus lines is 8 times that of the current products, the effect described above is prominent.

Modification 1 of First Embodiment

FIG. 4 is a circuit diagram showing a part of a NOR-type flash memory, which is a semiconductor memory device according to a modification 1 of the first embodiment. The memory shown in FIG. 4 has a non-selected data line charge circuit 14a different from that of the memory shown in FIG. 1.

The charge circuit 14a includes 16 sense amplifiers (S/A) SC0, SC8, . . . , SC7, and SC15 (SC2 to SC7 and SC10 to SC15 are not shown) connected to the 16 bit data lines Dn and Dn+8 to charge them. Between the data lines Dn and Dn+8 and the sense amplifiers SCn and SCn+8, 16 third transistors of the NMOS type TBn and TBn+8 for selecting non-selected data lines are respectively interposed. The sense amplifiers SCn and SCn+8 are configured to have a charge function equivalent to the sense amplifiers Sn and Sn+8 in the read circuit.

Figure 5:
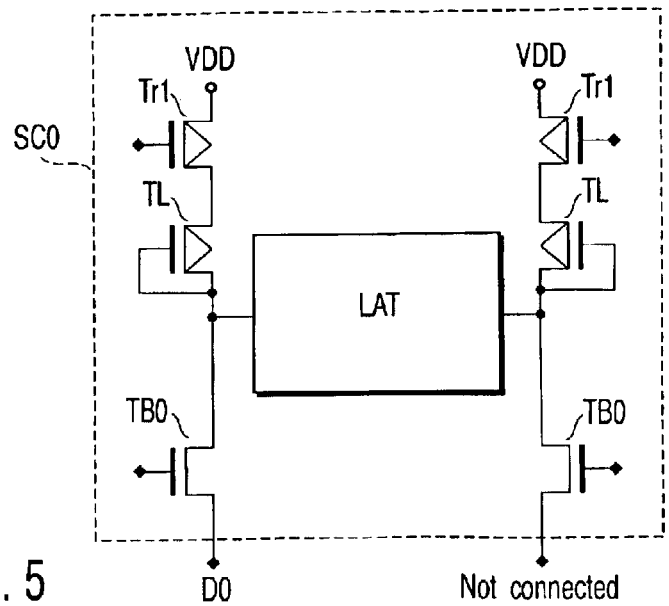
FIG. 5 is a circuit diagram showing a concrete example of one of the sense amplifiers for charging non-selected data lines in FIG. 4.

FIG. 5 is a circuit diagram showing a concrete example of SC0, as one of the sense amplifiers SCn and SCn+8 for charging non-selected data lines in FIG. 4.

The sense amplifier SC0 includes a latch circuit LAT of the current mirror load type, the same as that shown in FIG. 2. The latch circuit LAT is connected to the data line D0 and a reference data line through a pair of third transistors TB0 of the NMOS type. The data line D0 is connected to a memory cell, while the reference data line is set floating. Load transistors TL of the PMOS type are respectively interposed between the third transistors TB0 and power supply nodes. Furthermore, transistors Tr1 of the PMOS type for charge timing control are respectively interposed between the load transistors TL and power supply nodes. The third transistors TB0 connected to the reference data line has a gate connected to the ground potential, so that this transistor is always set in the off-state.

According to the NOR-type flash memory shown in FIG. 4, the charge route to selected data lines from the sense amplifiers Sn and Sn+8, and the charge route to non-selected data lines from the sense amplifiers SCn and SCn+8 have almost the same arrangement. As a consequence, the charge characteristics to the respective data lines become advantageously uniform.

Modification 2 of First Embodiment

Figure 6:
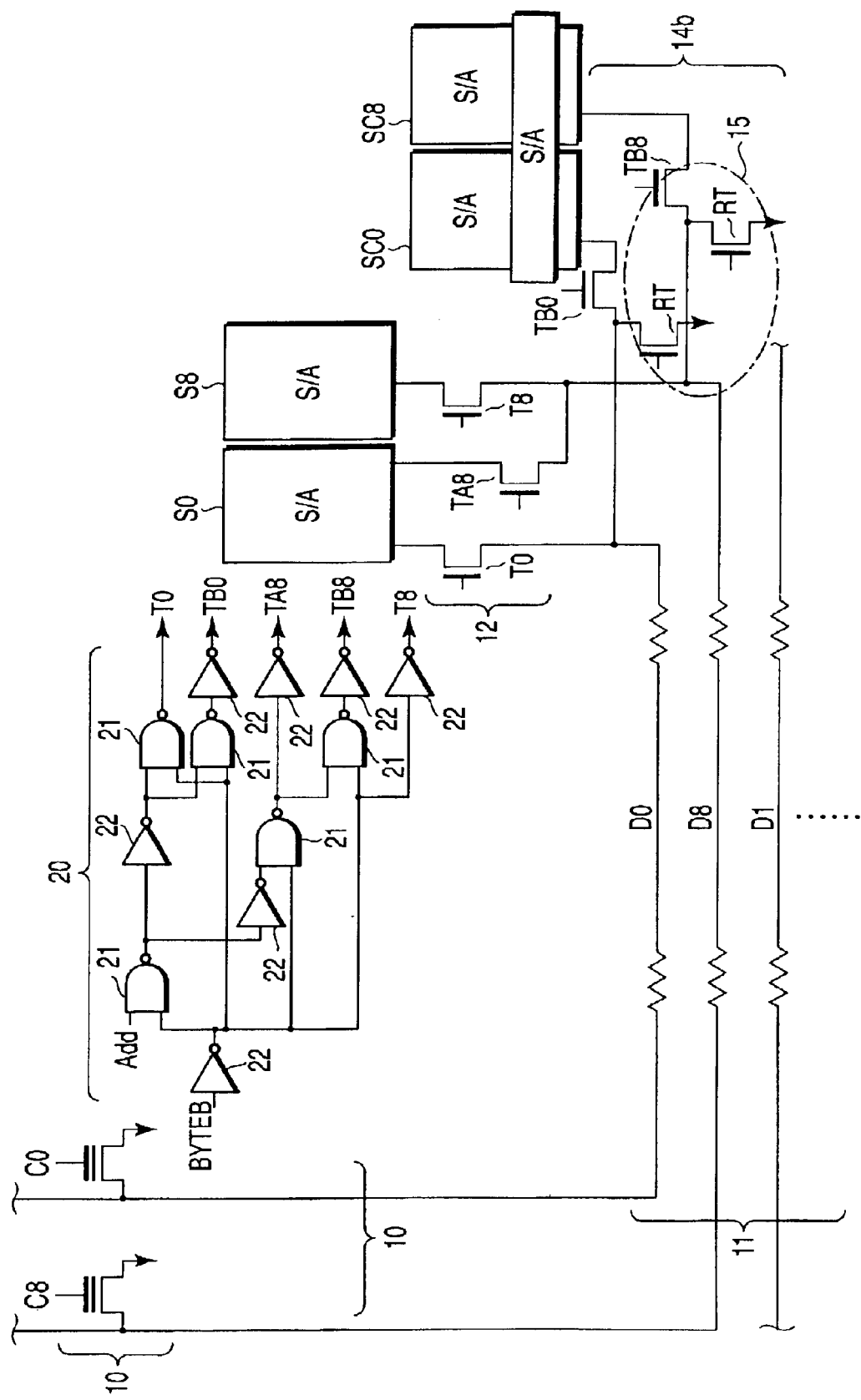
FIG. 6 is a circuit diagram showing a part of a NOR-type flash memory, which is a semiconductor memory device according to a modification 2 of the first embodiment.

FIG. 6 is a circuit diagram showing a part of a NOR-type flash memory, which is a semiconductor memory device according to a modification 2 of the first embodiment. The memory shown in FIG. 6 has a non-selected data line charge circuit 14b further different from those described above.

Modifying the charge circuit 14a shown in FIG. 4 can provide the charge circuit 14b. Specifically, reset circuits 15 formed of, e.g., transistors RT for discharge are respectively interposed between the ends of the data lines Dn and Dn+8 on the third transistor side and ground nodes. In the BYTE read mode, when data is read, the discharge transistors RT receive control signals on their gates and are set in the on-state, before the charge circuit 14b charges non-selected data lines. As a consequence, in the BYTE read mode, when data is read, the initial potentials of the data lines Dn and Dn+8 can be set uniform in advance, thereby improving the read characteristic.

Modification 3 of First Embodiment

The charge circuit 14 shown in FIG. 1 may be modified, such that transistors Tr1 for charge timing control are respectively interposed between the data line load transistors TL and charge power supply nodes, as in the sense amplifiers shown in FIG. 5. In this case, the charge route to selected data lines from the sense amplifiers, and the charge route to non-selected data lines from the charge circuit have almost the same arrangement. As a consequence, the charge characteristics to the respective data lines become advantageously uniform.

Modification 4 of First Embodiment

Figure 7:
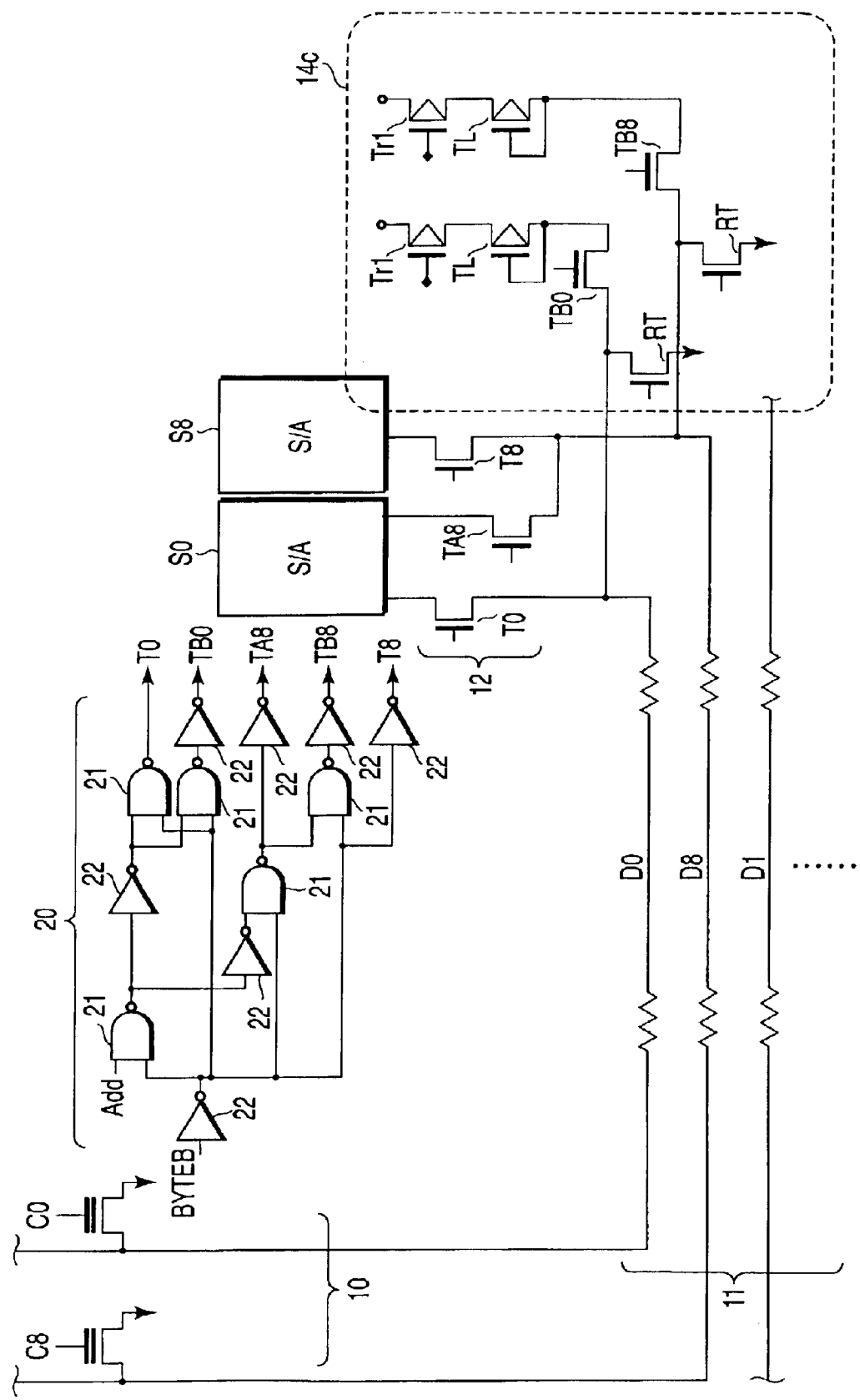
FIG. 7 is a circuit diagram showing a part of a NOR-type flash memory, which is a semiconductor memory device according to a modification 4 of the first embodiment.

FIG. 7 is a circuit diagram showing a part of a NOR-type flash memory, which is a semiconductor memory device according to a modification 4 of the first embodiment. The memory shown in FIG. 7 has a non-selected data line charge circuit 14c further different from those described above.

Modifying the charge circuit 14 shown in FIG. 1 can provide the charge circuit 14c. Specifically, transistors Tr1 for charge timing control are respectively interposed between the data line load transistors TL and charge power supply nodes, as in the sense amplifiers shown in FIG. 5. Furthermore, discharge transistors (reset transistors) RT are respectively interposed between the ends of the data lines Dn and Dn+8 on the third transistor side and ground nodes, as in the structure shown in FIG. 6.

According to the NOR-type flash memory shown in FIG. 7, the charge route to selected data lines from the sense amplifiers Sn and Sn+8, and the charge route to non-selected data lines from the sense amplifiers SCn and SCn+8 have almost the same arrangement. As a consequence, the charge characteristics to the respective data lines become advantageously uniform. Furthermore, as compared to the sense amplifiers shown in FIG. 5, no latch circuit LAT of the current mirror load type is necessary, thereby simplifying the circuit structure.

In the BYTE read mode, when data is read, the discharge transistors RT receive control signals on their gates and are set in the on-state, before the charge circuit 14c charges non-selected data lines. As a consequence, in the BYTE read mode, when data is read, the initial potentials of the data lines Dn and Dn+8 can be set uniform in advance, thereby improving the read characteristic.

Second Embodiment

Figures 8A, 8B:
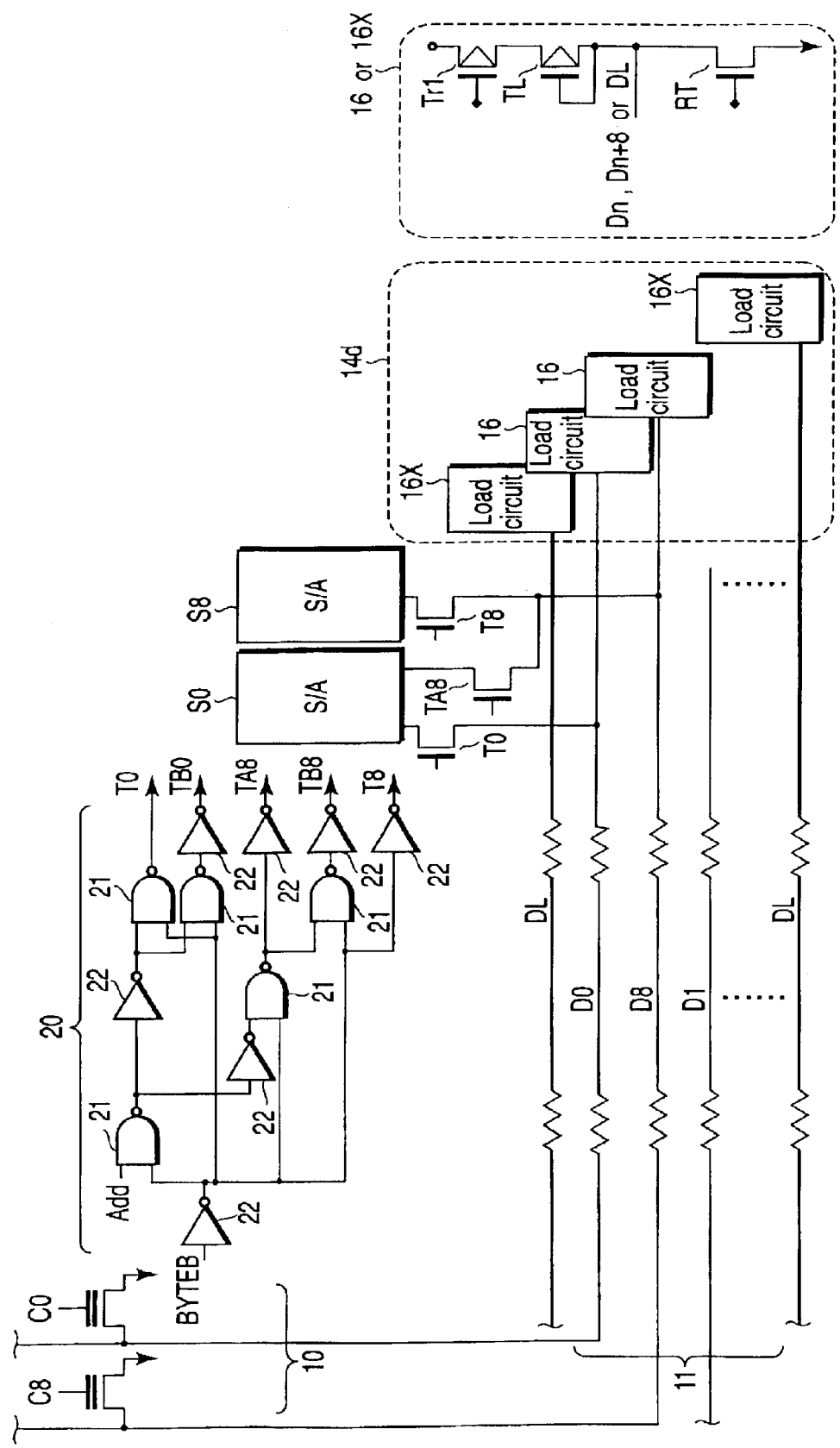
FIG. 8A is a circuit diagram showing a part of a NOR-type flash memory, which is a semiconductor memory device according to a second embodiment of the present invention.
FIG. 8B is a circuit diagram showing a load circuit used in the memory shown in FIG. 8A.

FIG. 8A is a circuit diagram showing a part of a NOR-type flash memory, which is a semiconductor memory device according to a second embodiment of the present invention.

FIG. 8B is a circuit diagram showing a load circuit used in the memory shown in FIG. 8A.

The second embodiment is conceived to solve a problem of the first embodiment, which is due to the coupling capacitance between each end data line of data lines Dn and Dn+8 disposed in a data line array 11, and a data line (not shown) disposed in an adjacent data line array. For example, where the coupling capacitance between an end data line within the data line array 11 and an end data line in an adjacent data line array differs from the coupling capacitance between the data lines within the data line array 11, the read speed is affected thereby.

Modifying the memory shown in FIG. 1 can provide the memory shown in FIG. 8A. Specifically, dummy data lines DL are respectively disposed outside the data lines Dn and Dn+8 of the data line array 11, to be adjacent to and parallel with their end data lines D0 and D15 (not shown) at the opposite ends. It is preferable that the distance between each end data line and the corresponding dummy data line DL be substantially the same as the intervals between the data lines Dn and Dn+8.

The data lines Dn and Dn+8 and dummy data lines DL are connected to a charge circuit 14d. The charge circuit 14d includes load circuits 16 for charging non-selected data lines, and dummy-side load circuits 16X for charging the dummy data lines DL. Each of the load circuits 16 and dummy-side load circuits 16X are arranged similarly to each data line load circuit in the charge circuit according to the first embodiment or its modification described above. FIG. 8B shows, as an example, a case where each load circuit 16 or 16X is arranged the same as each non-selected data line load circuit in the charge circuit 14c shown in FIG. 7.

According to the memory shown in FIG. 8A, in the BYTE read mode, when data is read, non-selected data lines are charged as in the memory according to the first embodiment or its modification described above. As a consequence, the same effect can be obtained as in the memory according to the first embodiment or its modification described above.

Furthermore, according to the memory shown in FIG. 8A, when data is read, the dummy data lines DL are charged, similarly to non-selected data lines. As a consequence, the coupling capacitance of the end data lines within the data line array 11 is reduced to a value near the coupling capacitance of the other data lines within the data line array 11. Since there is no difference between the BYTE read mode and WORD read mode in the coupling capacitance of all the selected data lines within the data line array 11, the read speed in the BYTE read mode, which is conventionally slower, is increased.

The second embodiment may be also designed similarly to the first embodiment or its modification described above. For example, the charge circuit 14d is preferably arranged to charge non-selected data lines and the dummy data lines DL with a potential almost equal to the read potential for selected data lines. The charge circuit 14d may start charging non-selected data lines and/or dummy data lines DL simultaneously with the timing when the sense amplifiers Sn and Sn+8 starts charging selected data lines. Furthermore, reset circuits or discharge transistors RT (see FIG. 8B) may be added, so that the initial potentials of the data lines Dn and Dn+8 and dummy data lines DL can be set uniform before charge starts.

Third Embodiment

Figures 9A, 9B:
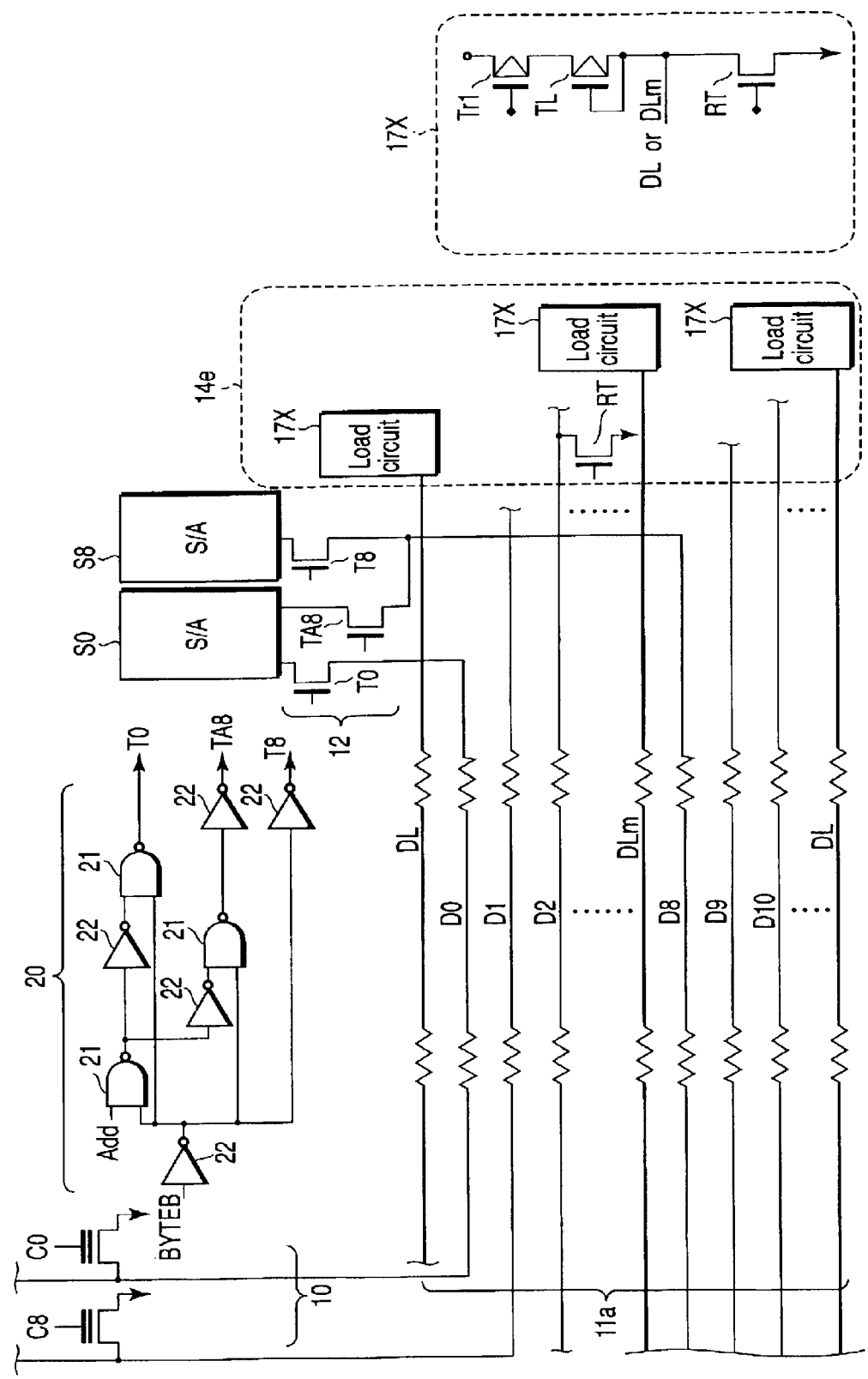
FIG. 9A is a circuit diagram showing a part of a NOR-type flash memory, which is a semiconductor memory device according to a third embodiment of the present invention.
FIG. 9B is a circuit diagram showing a load circuit used in the memory shown in FIG. 9A.

FIG. 9A is a circuit diagram showing a part of a NOR-type flash memory, which is a semiconductor memory device according to a third embodiment of the present invention. FIG. 9B is a circuit diagram showing a load circuit used in the memory shown in FIG. 9A.

As shown in FIG. 9A, a data line array 11a is connected to a memory cell array 10. The data line array 11a includes data lines D0 to D15 (D3 to D7 and D11 to D15 are not shown) arrayed in parallel with each other at regular intervals except the interval between the data lines D7 and D8. To the data lines D0 to D15, 16 bits of data constituting word data stored in the memory cell array 10 are respectively read out. The 16 bit data lines Dn and Dn+8 are divided into a group of lower order 8 bit data lines Dn and a group of higher order 8 bit data lines Dn+8, while the two groups are disposed adjacent to each other.

The memory shown in FIG. 9A can also switch between a WORD read mode and a BYTE read mode, in accordance with a control signal, e.g., externally inputted. In the WORD read mode, when data is read, the 16 bit data lines Dn and Dn+8 are selected and charged all together. On the other hand, in the BYTE read mode, when data is read, the group of lower order 8 bit data lines Dn or the group of higher order 8 bit is data lines Dn+8 are selected and charged.

The third embodiment is conceived to solve a problem in a structure of the kind described above, which is due to the coupling capacitance between the data lines D7 and D8, i.e., between the two groups of data lines. Specifically, for example, in the BYTE read mode, the lower order 8 bit data lines Dn are selected and charged, while the rest of the lines, i.e., the higher order 8 bit data lines Dn+8, are not selected but set at the ground potential. In this case, the coupling capacitance between the data lines D7 and D8 becomes larger than the coupling capacitance between the other data lines. As a consequence, the data read speed in the BYTE read mode is lower than that in the WORD read mode.

In order to solve this problem, an intermediate dummy data line DLm is disposed between the group of lower order 8 bit data lines Dn and the group of higher order 8 bit data lines Dn+8 (i.e., between the data lines D7 and DB), to be adjacent to and parallel with the data lines D7 and D8. It is preferable that the distance between each of the data lines D7 and D8 and the intermediate dummy data line DLm be substantially the same as the intervals between the data lines Dn and Dn+8.

Furthermore, dummy data lines DL are respectively disposed outside the data lines Dn and Dn+8 of the data line array 11a, to be adjacent to and parallel with their end data lines D0 and D15 (not shown) at the opposite ends, as in the second embodiment. It is preferable that the distance between each end data line and the corresponding dummy data line DL be substantially the same as the intervals between the data lines Dn and Dn+8.

The intermediate dummy data lines DLm and dummy data lines DL are connected to a charge circuit 14e. The charge circuit 14e includes dummy-side load circuits 17X for charging the dummy data lines DLm and DL. Each of the dummy-side load circuits 17X are arranged similarly to each data line load circuit in the charge circuit according to the first embodiment or its modification described above. FIG. 9B shows, as an example, a case where each dummy-side load circuit 17X is arranged the same as each non-selected data line load circuit in the charge circuit 14c shown in FIG. 7.

In the WORD read mode, when data is read, all the dummy data lines DLm and DL are selected and charged by the dummy-side load circuits 17X. In the BYTE read mode, when data is read, only the intermediate dummy data lines DLm and one of the dummy data lines DL, which sandwich one (Dn or Dn+8) of the groups of data lines Dn and Dn+8 not selected by the switch element group 12, are selected and charged by the dummy-side load circuits 17X.

The switch element group 12 are switched by a control signal generation circuit 20a to perform selection of the 16 bit data lines Dn and Dn+8. The control signal generation circuit 20a is a logic circuit constituted of logic gates including a group of NAND gates 21 and a group of inverters 22, to generate and supply signals for performing control as follows.

When a BYTE read mode setting signal BYTEB is at "H", the WORD read mode is set. In this case, the control signal generation circuit 20a generates control signals to perform the following operation. Specifically, all the first transistors Tn and Tn+8 are turned on. All the second transistors TAn+8 are turned off.

On the other hand, when the BYTE read mode setting signal BYTEB is at "L", the BYTE read mode is set. In this case, the control signal generation circuit 20a generates control signals to perform the following operation. Specifically, the 8 first transistors Tn+8 connected to the higher order bit data lines Dn+8 are turned off.

Furthermore, in the BYTE read mode, when an address signal Add is at "L", the lower order bits are selected. In this case, the control signal generation circuit 20a generates control signals to perform the following operation. Specifically, the 8 first transistors Tn connected to the lower order bit data lines Dn are turned on. All the second transistors TAn+8 are turned off.

In the BYTE read mode, when the address signal Add is at "H", the higher order bits are selected. In this case, the control signal generation circuit 20a generates control signals to perform the following operation. Specifically, all the second transistors TAn+8 are turned on. The 8 first transistors Tn connected to the lower order bit data lines Dn are turned off.

According to the memory shown in FIG. 9A, when data is read, the intermediate dummy data line DLm is charged, similarly to non-selected data lines. As a consequence, the coupling capacitance of the data lines D7 and D8 at the boundary region between the lower order 8 bit data lines Dn and higher order 8 bit data lines Dn+8 is reduced to a value near the coupling capacitance of the other data lines within the data line array 11a. Furthermore, when data is read, the dummy data lines DL on the opposite sides of the data line array 11a are also charged, similarly to non-selected data lines. As a consequence, the coupling capacitance of the end data lines within the data line array 11a is reduced to a value near the coupling capacitance of the other data lines within the data line array 11a. Since there is no difference between the BYTE read mode and WORD read mode in the coupling capacitance of all the selected data lines within the data line array 11a, the read speed in the BYTE read mode, which is conventionally slower, is increased.

The third embodiment may also be designed similarly to the first embodiment, its modification, or second embodiment described above. For example, the charge circuit 14e is preferably arranged to charge the dummy data lines DLm and DL with a potential almost equal to the read potential for selected data lines. The charge circuit 14e may start charging the dummy data lines DLm and DL simultaneously with the timing when the sense amplifiers Sn and Sn+8 start charging selected data lines. Furthermore, reset circuits or discharge transistors RT may be respectively connected to the data lines Dn and Dn+8 (for example, FIG. 9A shows a transistor RT connected to the data line D2), so that the initial potentials of the data lines Dn and Dn+8 and dummy data lines DLm and DL can be set uniform before charge starts.

In semiconductor memory devices according to the first to third embodiments of the present invention, they can switch between the WORD read mode and BYTE read mode, while insuring a high read speed equally in the two modes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array;

a data line array connected to the memory cell array, and comprising 16 bit data lines for 16 bits constituting word data, the 16 bit data lines being arranged such that a first group of lower order 8 bit data lines and a second group of higher order 8 bit data lines are alternately disposed one line by one line;

a read circuit configured to perform selection of the data lines, and charge selected data lines to read data, the read circuit being arranged to select and charge all the 16 bit data lines when reading data in a word data read mode, and to select and charge one of the first and second groups when reading data in a byte data read mode; and a non-selection-side charge circuit configured to select and charge non-selected data lines, which belong to the other of the first and second groups not selected by the read circuit when reading data in the byte data read mode.

2. The device according to claim 1, wherein the read circuit comprises a first charge section and a first switch section configured to selectively connect the 16 bit data lines to the first charge section, the non-selection-side charge circuit comprises a second charge section and a second switch section configured to selectively connect the 16 bit data lines to the second charge section, and the device further comprises a control signal generation circuit configured to generate a control signal for operating the first and second switch sections from a read mode setting signal.

3. The device according to claim 2, wherein the first charge section comprises a plurality of first charge elements, each of which is connected, in common, to a pair of data lines, the pair comprising a data line of the first group and a data line of the second group, and the first switch section comprises a plurality of first switch elements, each of which selectively connects one of a data line of the first group and a data line of the second group in the pair to a corresponding first charge element.

4. The device according to claim 1, wherein the non-selection-side charge circuit is configured to charge the non-selected data lines with a potential substantially equal to a read potential for the selected data lines.

5. The device according to claim 4, wherein the read circuit and the non-selection-side charge circuit comprise charge sections of substantially the same charge function.

6. The device according to claim 1, wherein the non-selection-side charge circuit starts charging the non-selected data lines simultaneously with timing when the read circuit starts charging the selected data lines.

7. The device according to claim 1, further comprising discharge transistors respectively connected to the 16 bit data lines to set initial potentials of the selected data lines to be uniform when reading data in the byte data read mode.

8. The device according to claim 1, further comprising a dummy data line disposed outside and adjacent to an end data line at an end of the data line array, and a dummy-side charge circuit configured to charge the dummy data line.

9. The device according to claim 8, wherein the dummy-side charge circuit is configured to charge the dummy data line with a potential substantially equal to a read potential for the selected data lines.

10. The device according to claim 8, further comprising discharge transistors respectively connected to the 16 bit data lines and the dummy data line to set initial potentials of the selected data lines and the dummy data line uniform.

11. A semiconductor memory device comprising:

a memory cell array;

a data line array connected to the memory cell array, and comprising 16 bit data lines for 16 bits constituting word data, the 16 bit data lines being arranged such that a first group of lower order 8 bit data lines and a second group of higher order 8 bit data lines are disposed adjacent to each other group by group;

an intermediate dummy data line extending in parallel with the data lines in a boundary region between the first group and the second group;

a read circuit configured to perform selection of the data lines, and charge selected data lines to read data, the read circuit being arranged to select and charge all the 16 bit data lines when reading data in a word data read mode, and to select and charge one of the first and second groups when reading data in a byte data read mode; and a first dummy-side charge circuit configured to charge the intermediate dummy data line when reading data in the word data read mode and the byte data read mode.

12. The device according to claim 11, wherein the first dummy-side charge circuit is configured to charge the intermediate dummy data line with a potential substantially equal to a read potential for the selected data lines.

13. The device according to claim 12, wherein the read circuit and the first dummy-side charge circuit comprise charge sections of substantially the same charge function.

14. The device according to claim 11, wherein the first dummy-side charge circuit starts charging the intermediate dummy data line simultaneously with timing when the read circuit starts charging the selected data lines.

15. The device according to claim 11, further comprising discharge transistors respectively connected to the 16 bit data lines and the intermediate dummy data line to set initial potentials of the selected data lines and the intermediate dummy data line to be uniform.

16. The device according to claim 11, further comprising end dummy data lines disposed outside and adjacent to end data lines at opposite ends of the data line array, and second dummy-side charge circuits configured to respectively charge the end dummy data lines.

17. The device according to claim 16, wherein the second dummy-side charge circuits are configured to charge the end dummy data lines with a potential substantially equal to a read potential for the selected data lines.

18. The device according to claim 16, further comprising discharge transistors respectively connected to the 16 bit data lines, the intermediate dummy data line, and the end dummy data lines to set initial potentials of the selected data lines, the intermediate dummy data line, and the end dummy data lines to be uniform.

* * * * *